US007876871B2

(12) United States Patent
Zhang

(10) Patent No.: US 7,876,871 B2
(45) Date of Patent: Jan. 25, 2011

(54) LINEAR PHASE FREQUENCY DETECTOR AND CHARGE PUMP FOR PHASE-LOCKED LOOP

(75) Inventor: Gang Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 782 days.

(21) Appl. No.: 11/565,062

(22) Filed: Nov. 30, 2006

(65) Prior Publication Data

US 2008/0129352 A1 Jun. 5, 2008

(51) Int. Cl.
*H03D 3/24* (2006.01)
(52) U.S. Cl. .................. 375/374; 375/327; 375/373; 375/375; 375/376
(58) Field of Classification Search .......... 375/374, 375/375, 376, 373, 327
See application file for complete search history.

(56) References Cited

U.S. PATENT DOCUMENTS

| | | | | |
|---|---|---|---|---|
| 6,049,233 | A * | 4/2000 | Shurboff | 327/2 |
| 6,285,225 | B1 | 9/2001 | Chu | |
| 6,462,624 | B1 | 10/2002 | Lee | |
| 6,605,935 | B2 * | 8/2003 | Nilsson | 324/76.53 |
| 6,717,908 | B2 | 4/2004 | Vijayan et al. | |
| 7,042,970 | B1 * | 5/2006 | Keaveney et al. | 375/371 |
| 7,092,475 | B1 * | 8/2006 | Huard | 375/375 |
| 7,203,475 | B2 | 4/2007 | Anand | |
| 2005/0083136 | A1 | 4/2005 | Chien | |
| 2005/0286462 | A1 | 12/2005 | Roh et al. | |

FOREIGN PATENT DOCUMENTS

WO WO0231988 4/2002

OTHER PUBLICATIONS

Written Opinion, PCT/US07/085658, International Search Authority, European Patent Office, Mar. 13, 2008.
International Search Report—PCT/US07/085658, International Search Authority, European Patent Office—Mar. 13, 2008.
Lee, et al., "Charge pump with perfect current matching characteristics in phase-locked loop", Electronic Letters, pp. 1907-1908, vol. 36, issue 23, Nov. 2000.
Pamarti, et al., "A wodebamd 2.4GHz delta-sigma fractional-N PLL with 1-Mb/s in-loop modulation", IEEE Journal of Solid-State Circuits, pp. 49-62, vol. 39, No. 1, Jan. 2004.

* cited by examiner

*Primary Examiner*—Ted M Wang
(74) *Attorney, Agent, or Firm*—Jiayu Xu

(57) ABSTRACT

Techniques for achieving linear operation for a phase frequency detector and a charge pump in a phase-locked loop (PLL) are described. The phase frequency detector receives a reference signal and a clock signal, generates first and second signals based on the reference and clock signals, and resets the first and second signals based on only the first signal. The first and second signals may be up and down signals, respectively, or may be down and up signals, respectively. The phase frequency detector may delay the first signal by a predetermined amount, generate a reset signal based on the delayed first signal and the second signal, and reset the first and second signals with the reset signal. The charge pump receives the first and second signals and generates an output signal indicative of phase error between the reference and clock signals.

35 Claims, 9 Drawing Sheets

US 7,876,871 B2

LINEAR PHASE FREQUENCY DETECTOR AND CHARGE PUMP FOR PHASE-LOCKED LOOP

BACKGROUND

I. Field

The present disclosure relates generally to circuits, and more specifically to a phase-locked loop.

II. Background

Phase-locked loops (PLLs) are commonly used in many electronics circuits and are particularly important in communication circuits. For example, digital systems use clock signals to trigger synchronous circuits, e.g., flip-flops. Transmitter and receiver systems use local oscillator (LO) signals for frequency upconversion and downconversion, respectively. Wireless devices (e.g., cellular phones) in wireless communication systems typically use clock signals for digital circuitry and LO signals for transmitter and receiver circuitry. Clock and LO signals are often generated with voltage-controlled oscillators (VCOs) operating within PLLs.

A PLL typically includes a phase frequency detector, a charge pump, a loop filter, and a VCO. The phase frequency detector, charge pump, loop filter collectively detect phase error between a reference signal and a clock signal derived from the VCO and generate a control signal for the VCO. The control signal adjusts the frequency of the VCO such that the clock signal is locked to the reference signal.

The phase frequency detector typically generates a pair of signals that is commonly referred to as up and down signals. One signal is typically turned on longer in each clock cycle depending on whether the clock signal is early or late relative to the reference signal. The up and down signals are used to couple current sources within the charge pump to the output. Ideally, the phase frequency detector and charge pump should have a linear transfer function of output charge versus phase error. However, due to mismatch of circuits used for the charge pump, this linear transfer function is typically not achieved. Consequently, the output change from the up signal is often not equal to the output charge from the down signal for phase errors of the same magnitude but opposite polarity. This charge error is due to up/down current mismatch in the charge pump, which may result from transistor device mismatch and other factors. Non-linearity of the charge pump due to current mismatch may cause additional phase noise that may degrade performance.

There is therefore a need in the art for a phase frequency detector and a charge pump that can provide good performance for a PLL.

SUMMARY

Techniques for achieving linear operation for a phase frequency detector and a charge pump in a PLL are described herein. In an aspect, the phase frequency detector uses a new timing/clocking scheme to generate up and down signals such that up/down current mismatch in the charge pump does not contribute to non-linear distortion in the first order. The new timing scheme uses only the up signal or only the down signal to reset flip-flops within the phase frequency detector. With the new timing scheme, up/down current mismatch in the charge pump does not show up in the output of the charge pump. Hence, good performance may be achieved even in the presence of transistor device mismatch.

In one design, a PLL includes a phase frequency detector and a charge pump. The phase frequency detector receives a reference signal and a clock signal, generates first and second signals based on the reference and clock signals, and resets the first and second signals based on only the first signal. The first and second signals may be up and down signals, respectively. Alternatively, the first and second signals may be down and up signals, respectively. The phase frequency detector may delay the first signal by a predetermined amount, generate a reset signal based on the delayed first signal and the second signal, and reset the first and second signals with the reset signal. The charge pump receives the first and second signals and generates an output signal indicative of phase error between the reference and clock signals. The phase frequency detector and charge pump may be implemented as described below.

Various aspects and features of the disclosure are described in further detail below.

DETAILED DESCRIPTION

The techniques described herein may be used for various types of circuits such as integer-N PLLs, fractional-N PLLs, multi-modulus dividers (MMDs), sigma-delta frequency synthesizers, etc. An integer-N PLL divides the frequency of an oscillator signal from a VCO by an integer divider ratio N, where $N \geq 1$. A fractional-N PLL divides the frequency of the oscillator signal by a non-integer divider ratio R, e.g., by N some of the time and by N+1 some other time, where $N<R<N+1$. A sigma-delta frequency synthesizer utilizes a sigma-delta modulator to generate the non-integer divider ratio R for the fractional-N PLL.

Figure 1:
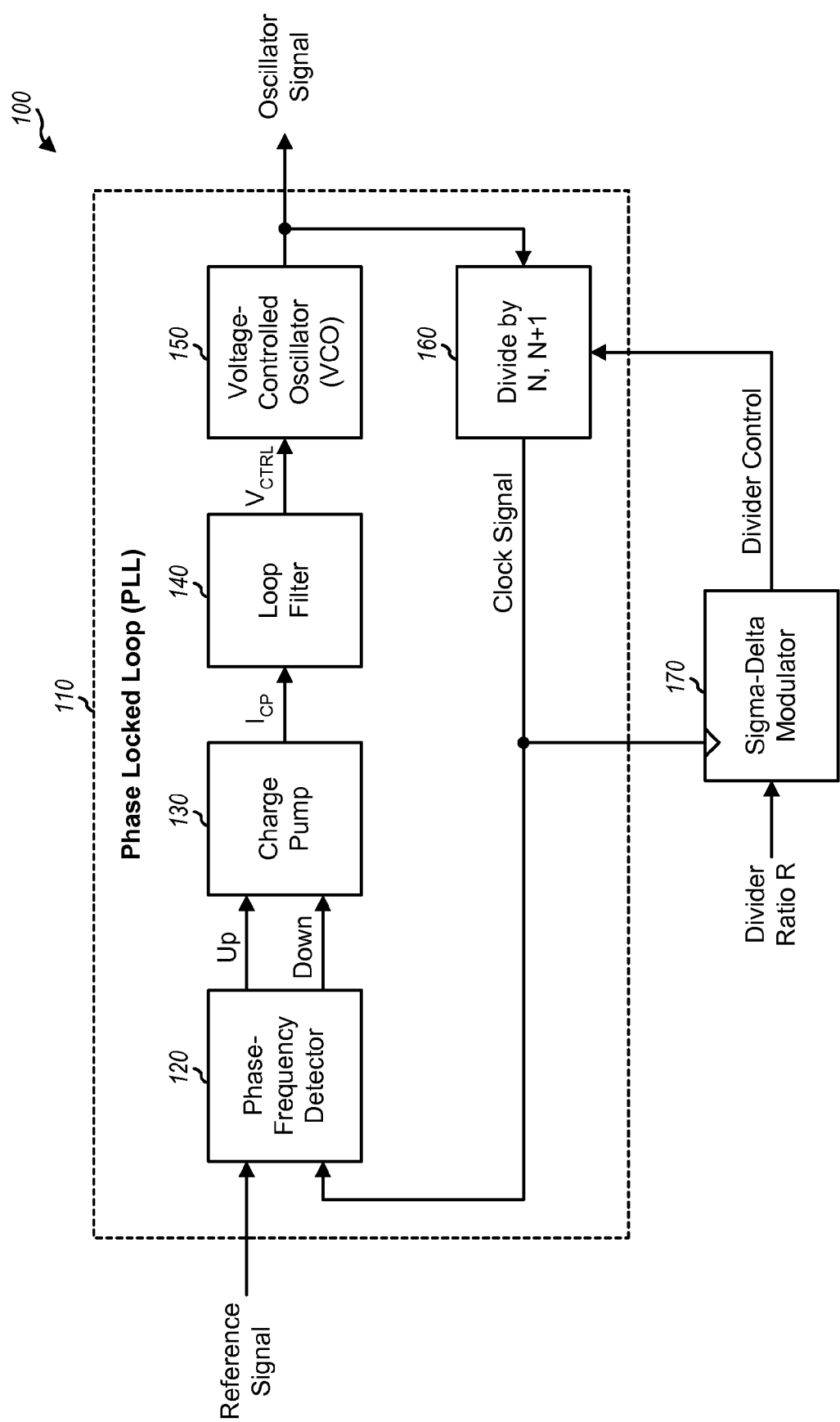
FIG. 1 shows a block diagram of a fractional-N PLL.

FIG. 1 shows a block diagram of a design of a sigma-delta frequency synthesizer 100 with a fractional-N PLL 110 and a sigma-delta modulator 170. PLL 110 includes a phase-frequency detector 120, a charge pump 130, a loop filter 140, a voltage-controlled oscillator (VCO) 150, and a divider 160.

Phase-frequency detector 120 receives a reference signal from a reference oscillator (not shown in FIG. 1) and a clock signal from divider 160, compares the phases of the two signals, and provides up and down signals indicative of the phase error/difference between the reference signal and the clock signal. The clock signal may also be referred to as divided clock signal, feedback signal, etc. The up and down signals are also commonly referred to as early and late signals, advance and retard signals, etc. Charge pump 130 receives the up and down signals and generates an output signal, which is a current $I_{CP}$ that is indicative of the detected phase error.

Loop filter 140 filters the output signal from charge pump 130 and generates a control signal $V_{CTRL}$ for VCO 150. Loop filter 140 adjusts the control signal such that the phase or frequency of the clock signal is locked to the phase or frequency of the reference signal. Loop filter 140 has a frequency response that is typically selected to achieve the desired closed-loop response for PLL 110. For example, the frequency response of loop filter 140 may be selected based on a tradeoff between acquisition and tracking performance and PLL noise performance.

VCO 150 generates an oscillator signal having a frequency that is determined by the control signal from loop filter 140. Divider 160 divides the oscillator signal in frequency by integer factors of N and N+1 and provides the clock signal. In general, N may be any positive integer value. Sigma-delta modulator 170 receives a divider ratio R, which may be expressed as:

$$R = \frac{f_{vco}}{f_{ref}}, \qquad \text{Eq (1)}$$

where $f_{vco}$ is the desired frequency for VCO 150, and $f_{ref}$ is the frequency of the reference signal.

Sigma-delta modulator 170 generates a divider control for divider 160 to achieve the divider ratio R. This divider control may be a 1-bit control that instructs divider 160 to divide by either N or N+1. For example, a logic low ('0') on the divider control may correspond to divide by N, and a logic high ('1') on the divider control may correspond to divide by N+1. The percentage of zeros and ones on the divider control is determined by the divider ratio R. However, the zeros are distributed on the divider control in a manner such that quantization noise is shifted to higher frequencies and good phase noise characteristic can be achieved for the oscillator signal from VCO 150.

FIG. 1 shows an example design of a PLL and a frequency synthesizer. In general, a PLL and a frequency synthesizer may be implemented with fewer, additional, and/or different circuit blocks than those shown in FIG. 1. For example, VCO 150 may be replaced with a current digital-to-analog converter (iDAC) and a current-controlled oscillator (ICO). Divider 160 may be a fixed integer-N divider. Loop filter 140 may be an adaptive loop filter having a variable loop response, which may be used to change the PLL loop bandwidth and/or damping. One or more additional dividers may also be used to divide the oscillator signal to generate one or more additional clock signals at other frequencies of interest.

Figure 2:
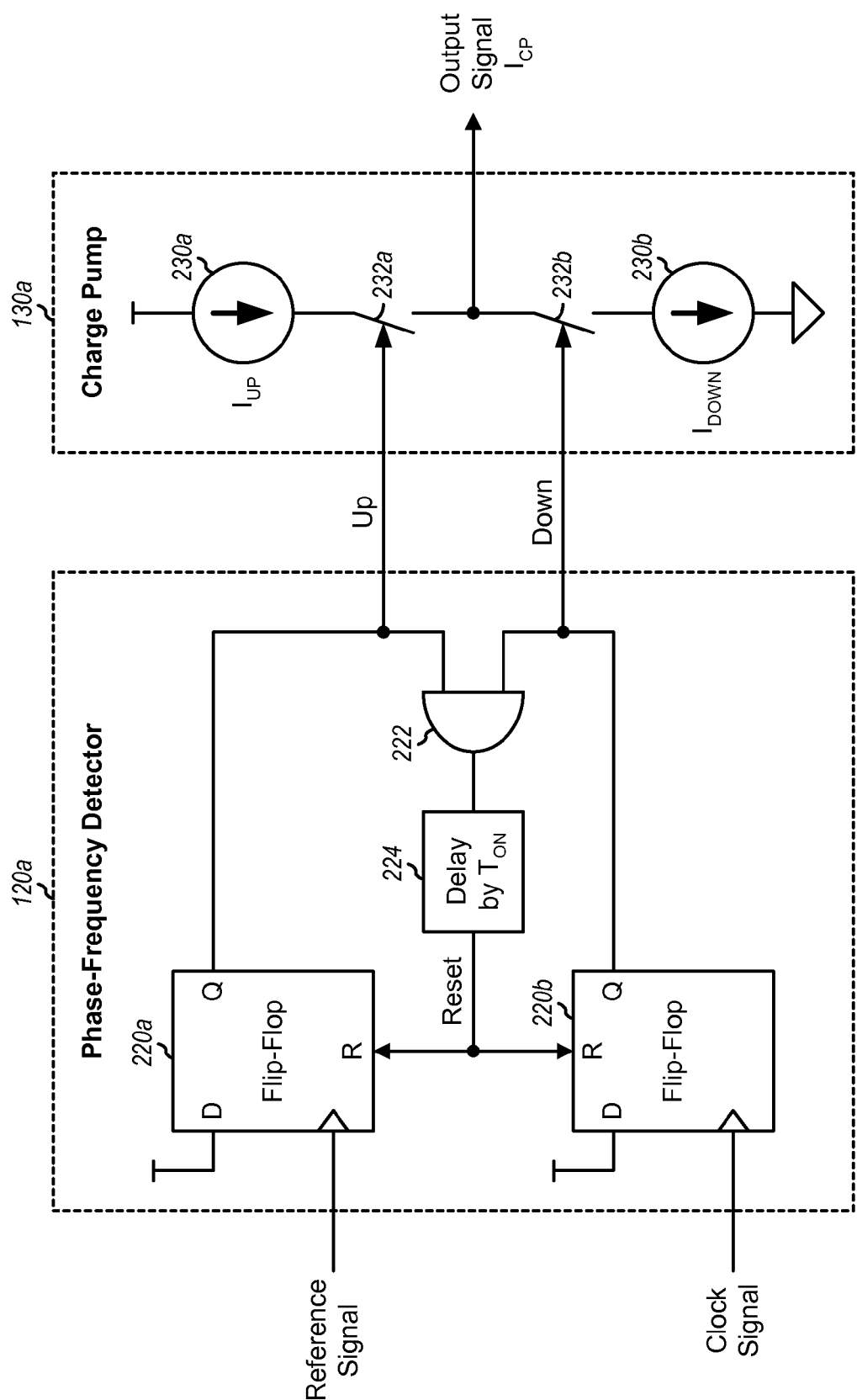
FIG. 2 shows a phase frequency detector and a charge pump for the PLL.

FIG. 2 shows a design of a phase frequency detector 120a and a charge pump 130a, which may be used for phase frequency detector 120 and charge pump 130, respectively, in FIG. 1.

Within phase frequency detector 120a, the reference signal and the clock signal are provided to the clock inputs of D flip-flops 220a and 220b, respectively. The data (D) inputs of flip-flops 220a and 220b are coupled to a power supply and receive logic high. The data (Q) outputs of flip-flops 220a and 220b provide the up and down signals, respectively. The up signal is indicative of the reference signal being early with respect to the clock signal. The down signal is indicative of the reference signal being late with respect to the clock signal. An AND gate 222 receives the up and down signals and performs a logical AND on the two signals. A delay unit 224 delays the output of AND gate 222 by a predetermined amount of time $T_{ON}$ and provides a reset signal to the reset (R) inputs of flip-flops 220a and 220b.

Within charge pump 130a, current sources 230a and 230b and switches 232a and 232b are coupled in series and between the power supply and circuit ground. Current source 230a provides a current of $I_{UP}$, and current source 230b provides a current of $I_{DOWN}$. Switch 232a receives the up signal and, when turned on by logic high on the up signal, couples current sources 230a to the output of charge pump 130a. Switch 232b receives the down signal and, when turned on by logic high on the down signal, couples current sources 230b to the output of charge pump 130a.

The $T_{ON}$ delay by unit 224 is used to combat a dead zone in the charge pump. Current sources 230a and 230b need some amount of time to turn on and off. This transition time is referred to as the dead zone since, during the transition time, phase information in the up and down signals is lost. The $T_{ON}$ delay combats the dead zone.

Figure 3:
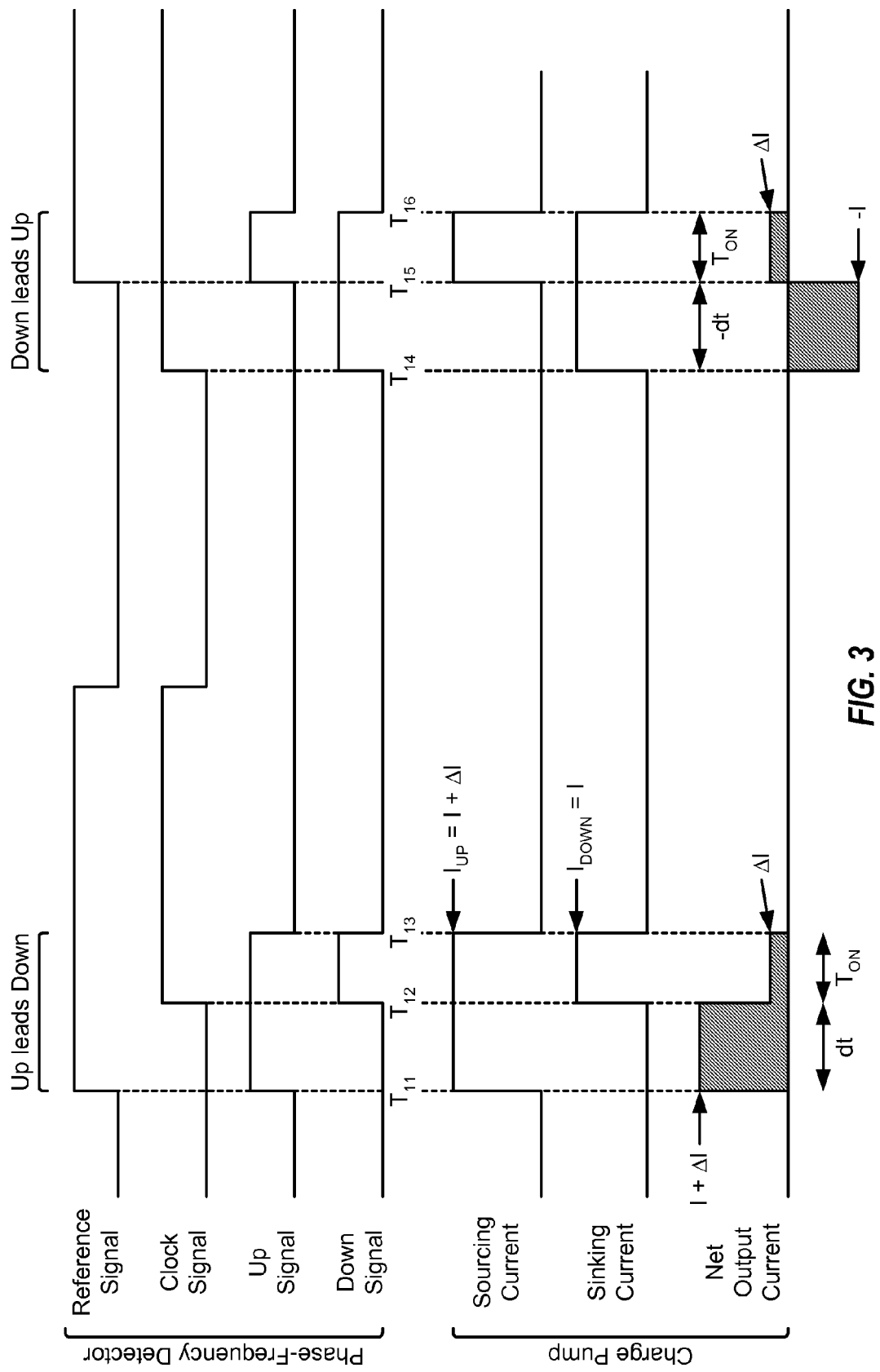
FIG. 3 shows a timing diagram for the phase frequency detector in FIG. 2.

FIG. 3 shows a timing diagram that illustrates the operation of phase frequency detector 120a in FIG. 2. Initially, the up and down signals are at logic low. At time $T_{11}$, the reference signal transitions from logic low to logic high, flip-flop 220a is triggered, and the up signal transitions to logic high. At time $T_{12}$, the clock signal transitions from logic low to logic high, flip-flop 220b is triggered, and the down signal transitions to logic high. When the up and down signals are both at logic high, the output of AND gate 222 transitions to logic high. At time $T_{13}$, which is approximately $T_{ON}$ later than $T_{12}$, the reset signal transitions to logic high, flip-flops 220a and 220b are both reset, and the up and down signals transition to logic low.

At time $T_{14}$, the clock signal transitions from logic low to logic high, flip-flop 220b is triggered, and the down signal transitions to logic high. At time $T_{15}$, the reference signal transitions from logic low to logic high, flip-flop 220a is triggered, and the up signal transitions to logic high. When the up and down signals are both at logic high, the output of AND gate 222 transitions to logic high. At time $T_{16}$, which is approximately $T_{ON}$ later than $T_{15}$, the reset signal transitions to logic high, flip-flops 220a and 220b are both reset, and the up and down signals transition to logic low.

As shown in FIG. 3, two pulses are generated on the up and down signals in each clock cycle. The up signal leads the down signal and has a longer pulse when the reference signal is early with respect to the clock signal. Conversely, the down signal leads the up signal and has a longer pulse when the reference signal is late with respect to the clock signal. In each clock cycle, the signal with the earlier rising edge sets its flip-flop first, and the signal with the later rising edge resets both flip-flops. Thus, the reference signal resets both flip-flops when it is later than the clock signal, and the clock signal resets both flip-flops when it is later than the reference signal.

FIG. 3 also illustrates the operation of charge pump 130a in FIG. 2. When the up signal leads the down signal, current source 230a provides a sourcing current of $I_{UP}$ from time $T_{11}$ to time $T_{13}$, and current source 230b provides a sinking current of $I_{DOWN}$ from time $T_{12}$ to time $T_{13}$. The net output current is the difference between the sourcing current and the sinking current from time $T_{11}$ to time $T_{13}$.

When the down signal leads the up signal, current source 230b provides a sinking current of $I_{DOWN}$ from time $T_{14}$ to time $T_{16}$, and current source 230a provides a sourcing current of $I_{UP}$ from time $T_{15}$ to time $T_{16}$. The net output current is the difference between the sourcing current and the sinking current from time $T_{14}$ to time $T_{16}$.

Ideally, current sources 230a and 230b should provide the same amount of current so that $I_{UP}=I_{DOWN}$. However, $I_{UP}$ is typically not equal to $I_{DOWN}$ due to transistor device mismatch and other factors. The mismatch between $I_{UP}$ and $I_{DOWN}$ may be modeled as $I_{DOWN}=I$ and $I_{UP}=I+\Delta I$, where I is the nominal current and $\Delta I$ is the amount of current mismatch.

When the up signal leads the down signal, e.g., from time $T_{11}$ to time $T_{13}$, the net output charge from charge pump 130a may be expressed as:

$$Q(dt)=I*dt+\Delta I*dt+\Delta I*T_{ON}, \qquad \text{Eq (2)}$$

where dt is the time difference between the rising edge of the reference signal and the rising edge of the clock signal, and Q(dt) is the output charge with the up signal leading the down signal.

When the down signal leads the up signal, e.g., from time $T_{14}$ to time $T_{16}$, the net output charge from charge pump 130a may be expressed as:

$$Q(-dt)=-I*dt+\Delta I*T_{ON}, \qquad \text{Eq (3)}$$

where –dt is the time difference between the rising edge of the reference signal and the rising edge of the clock signal, and Q(–dt) is the net charge with the down signal leading the up signal.

In equations (2) and (3), the terms "I*dt" and "–I*dt" correspond to the desired components, the term "$\Delta I*dt$" corresponds to a non-linear distortion component, and the term $\Delta I*T_{ON}$ corresponds to direct current (DC) offset. The DC offset results in a static phase offset between the reference signal and the clock signal and generally does not impact performance. The non-linear component may however degrade phase noise and cause other deleterious effects.

Figure 4A:
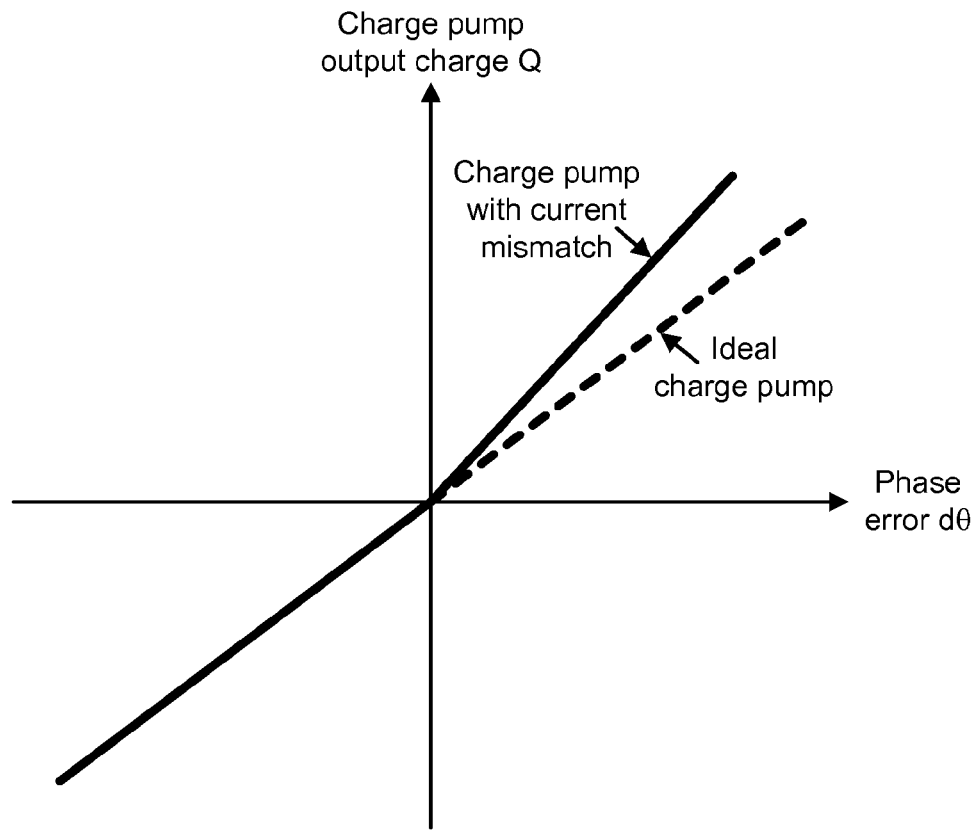
FIG. 4A shows a charge transfer function for the charge pump in FIG. 2.

FIG. 4A shows a transfer function of output charge Q from charge pump 130a versus phase error dθ. Phase error and time difference are related and may be given as: $d\theta=2\pi*dt/T_{REF}$, where $T_{REF}$ is the duration of one cycle of the reference signal. Ideally, the transfer function should be a straight line with a slope determined by current I. However, due to current mismatch $\Delta I$, the transfer function is composed of one straight line for negative phase error and another straight line for positive phase error. The straight line for positive phase error has higher slope if $I_{UP}>I_{DOWN}$, as shown in FIGS. 3 and 4A.

Figure 4B:
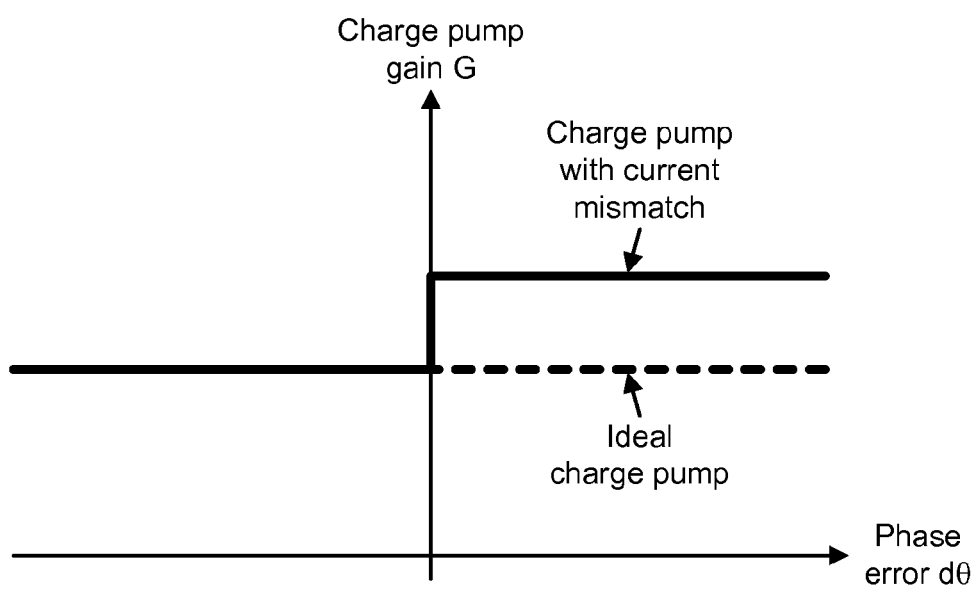
FIG. 4B shows a gain function for the charge pump in FIG. 2.

FIG. 4B shows a gain function for charge pump 130a versus phase error dθ. The charge pump gain G may be given as $G=dQ/d\theta$. Ideally, the charge pump gain should be constant for all phase errors. However, due to current mismatch $\Delta I$, the charge pump gain is one value for negative phase error and another value for positive phase error. The charge pump gain for positive phase error is higher if $I_{UP}>I_{DOWN}$, as shown in FIGS. 3 and 4B.

The current mismatch $\Delta I$ may result from mismatch in transistor devices used to implement current sources 230a and 230b, changes in the power supply voltage for the charge pump, and other factors. Device mismatch may be reduced by using large device sizes and following good design guidelines. However, large device sizes occupy more circuit area, which is undesirable. Furthermore, device mismatch is not completely eliminated even with large device sizes. Hence, the charge pump can be expected to have some current mismatch.

In an aspect, a phase frequency detector uses a new timing/clocking scheme to generate up and down signals such that up/down current mismatch in a charge pump does not contribute to non-linear distortion in the first order. The new timing scheme uses only the up signal or only the down signal to reset the flip-flops within the phase frequency detector. This is different from the timing scheme shown in FIG. 2 where the up and down signals can both reset the flip-flops. With the new timing scheme, the up/down current mismatch in the charge pump does not show up in the output of the charge pump. Hence, good performance may be achieved even in the presence of transistor device mismatch in the charge pump.

Figure 5A:
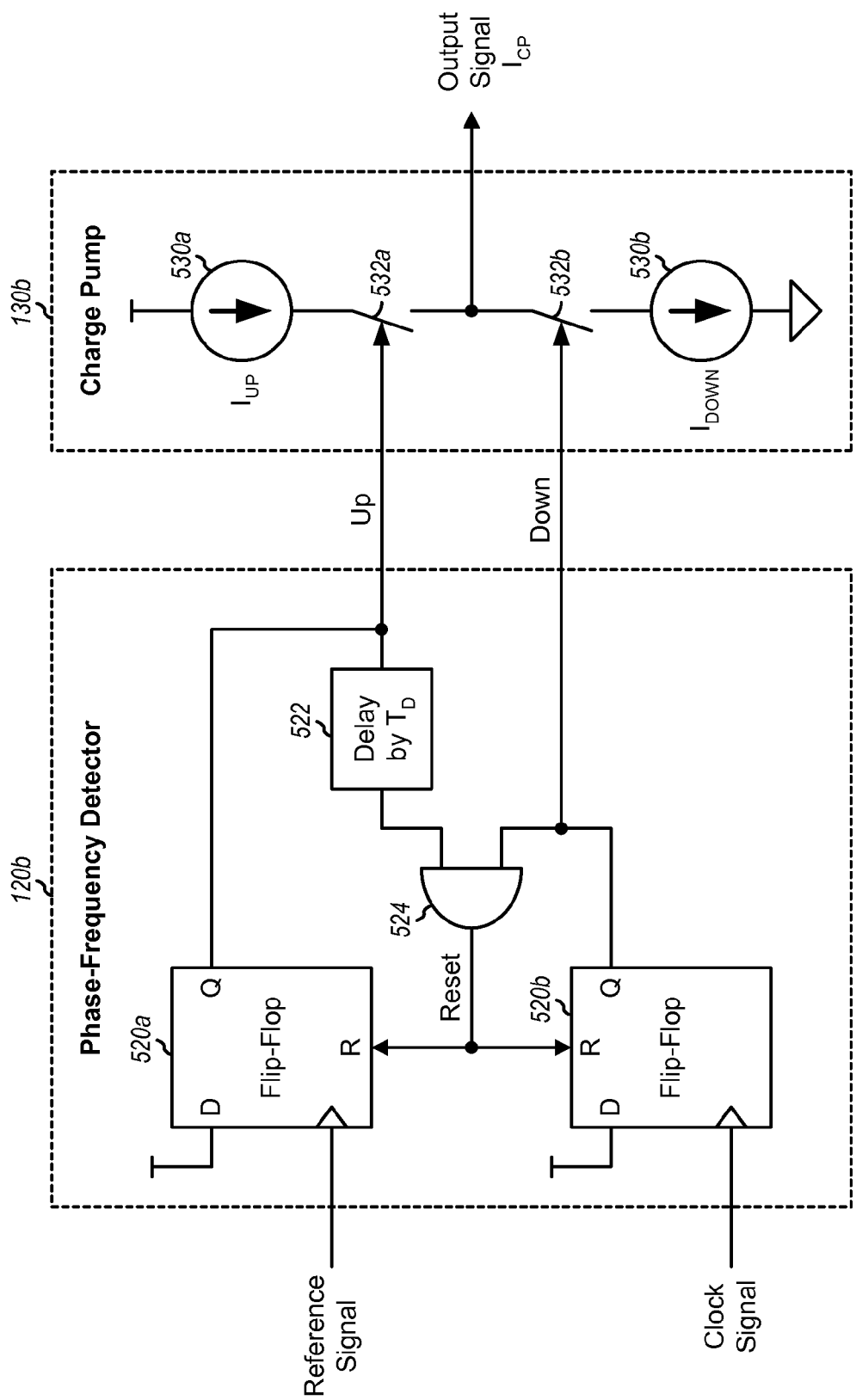
FIG. 5A shows a linear phase frequency detector and charge pump.

FIG. 5A shows a design of a phase frequency detector 120b and a charge pump 130b, which may be used for phase frequency detector 120 and charge pump 130, respectively, in FIG. 1. Phase frequency detector 120b resets its flip-flops based solely on the up signal.

Within phase frequency detector 120b, the reference signal and the clock signal are provided to the clock inputs of D flip-flops 520a and 520b, respectively. The D inputs of flip-flops 520a and 520b are coupled to the power supply. The Q outputs of flip-flops 520a and 520b provide the up and down signals, respectively. A delay unit 522 delays the up signal by a predetermined amount of time $T_D$. An AND gate 524 receives the delayed up signal and the down signal, performs a logical AND on the two signals, and provides a reset signal to the R inputs of flip-flops 520a and 520b.

Charge pump 130b includes current sources 530a and 530b and switches 532a and 532b that are coupled in series and between the power supply and circuit ground. Switch 532a receives the up signal and couples current source 530a to the charge pump output. Switch 532b receives the down signal and couples current source 530b to the charge pump output.

Figure 5B:
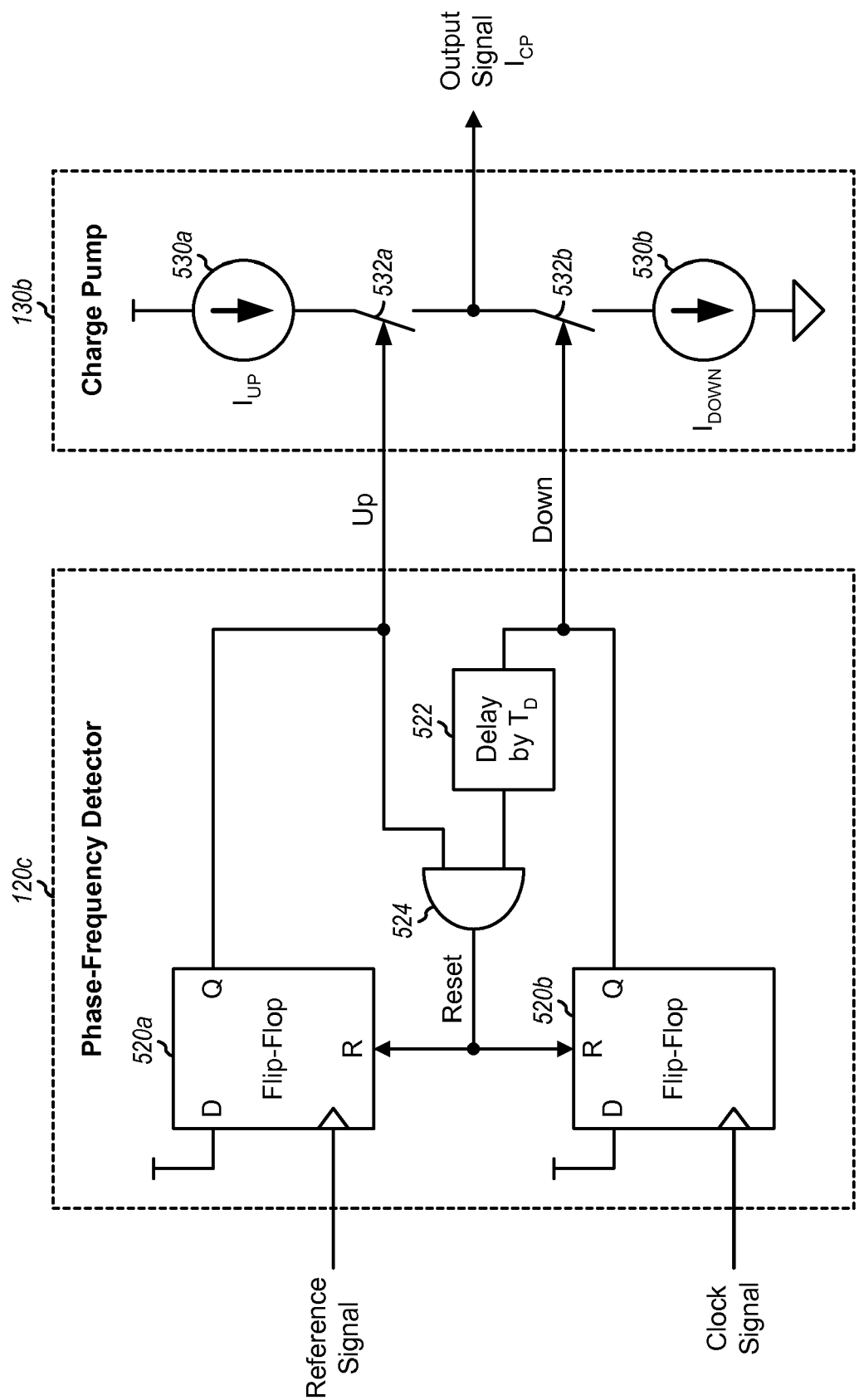
FIG. 5B shows another linear phase frequency detector and charge pump.

FIG. 5B shows a design of a phase frequency detector 120c, which may also be used for phase frequency detector 120 in FIG. 1. Phase frequency detector 120c resets its flip-flops based solely on the down signal. Phase frequency detector 120c includes flip-flops 520a and 520b, delay unit 522, and AND gate 524. However, unlike FIG. 5A, delay unit 522 delays the down signal by the predetermined amount of time $T_D$. AND gate 524 receives the delayed down signal and the up signal and provides the reset signal to flip-flops 520a and 520b.

As shown in FIGS. 5A and 5B, the new timing scheme for the phase frequency detector may be implemented with little circuitry. Other circuits may also be designed to reset the flip-flops based on only the up signal or only the down signal.

Figure 6:
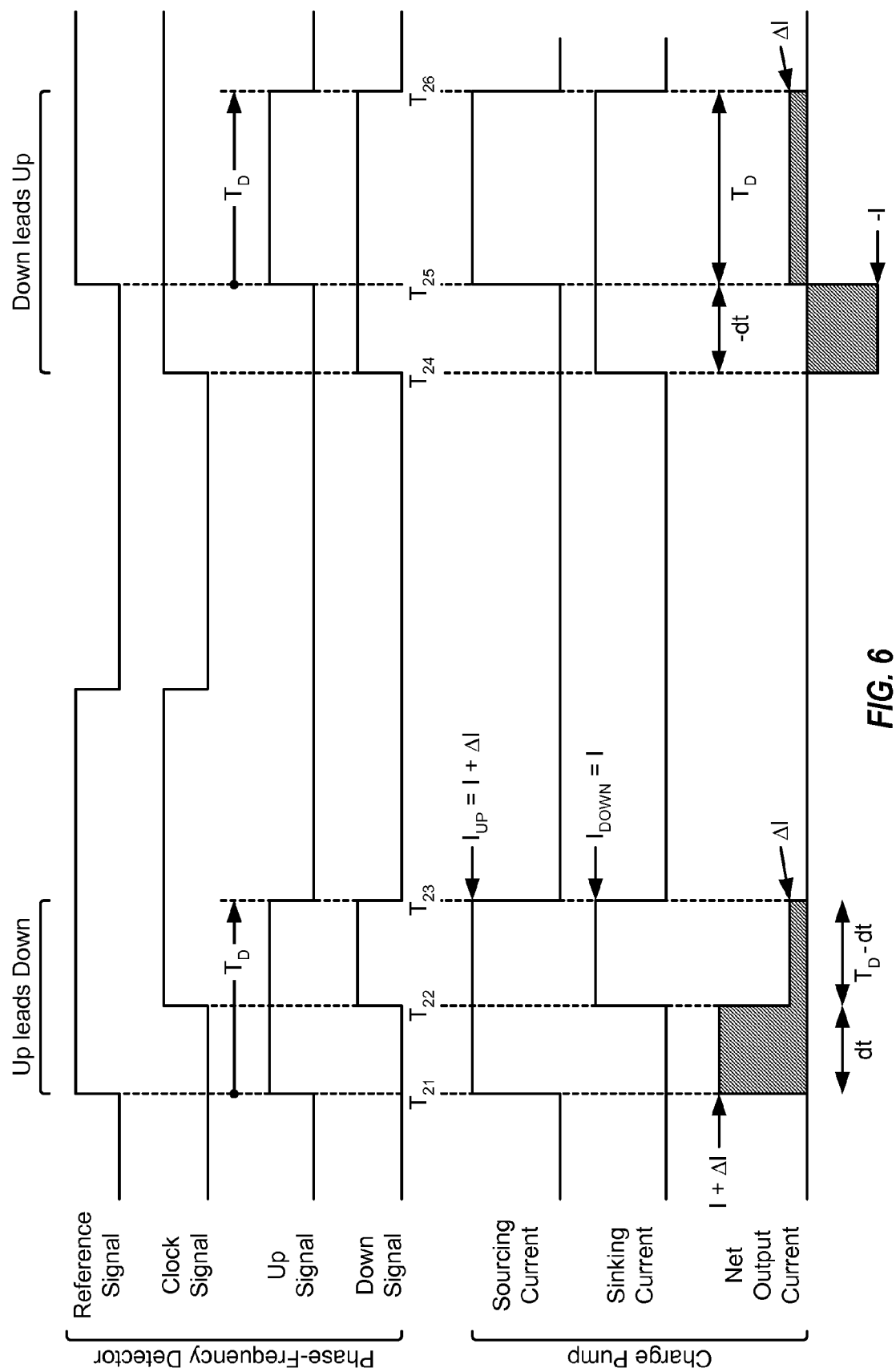
FIG. 6 shows a timing diagram for the phase frequency detector in FIG. 5A.

FIG. 6 shows a timing diagram that illustrates the operation of phase frequency detector 120b in FIG. 5A. Initially, the up and down signals are at logic low. At time $T_{21}$, the reference signal transitions to logic high, flip-flop 520a is triggered, and the up signal transitions to logic high. At time $T_{22}$, the clock signal transitions to logic high, flip-flop 520b is triggered, and the down signal transitions to logic high. At time $T_{23}$, which is approximately $T_D$ later than $T_{21}$, the delayed up signal and the down signal at the inputs of AND gate 522 are both at logic high, and AND gate 522 provides logic high on the reset signal. Flip-flops 520a and 520b are then both reset, and the up and down signals transition to logic low.

At time $T_{24}$, the clock signal transitions to logic high, flip-flop 520b is triggered, and the down signal transitions to logic high. At time $T_{25}$, the reference signal transitions to logic high, flip-flop 520a is triggered, and the up signal transitions to logic high. At time $T_{26}$, which is approximately $T_D$ later than $T_{25}$, the delayed up signal and the down signal at the inputs of AND gate 522 are both at logic high, and AND gate 522 provides logic high on the reset signal. Flip-flops 520a and 520b are then both reset, and the up and down signals transition to logic low.

As shown in FIG. 6, only the up signal resets the flip-flops regardless of whether the reference signal or the clock signal is earlier. In each clock cycle, the signal with the earlier rising edge sets its flip-flop first, and the up signal resets both flip-flops.

FIG. 6 also illustrates the operation of charge pump 130b in FIG. 5A. When the up signal leads the down signal, e.g., from time $T_{21}$ to time $T_{23}$, the output charge from charge pump 130b may be expressed as:

$$Q(dt) = I*dt + \Delta I*dt + \Delta I*(T_D - dt) \qquad \text{Eq (4)}$$
$$= I*dt + \Delta I*T_D.$$

When the down signal leads the up signal, e.g., from time $T_{24}$ to time $T_{26}$, the output charge from charge pump 130b may be expressed as:

$$Q(-dt) = -I*dt + \Delta I*T_D. \qquad \text{Eq (5)}$$

In equations (2) and (3), the terms "I*dt" and "−I*dt" correspond to the desired components, and the term "$\Delta I*T_D$" corresponds to DC offset. The up/down current mismatch in current sources 530a and 530b does not show up in the output of charge pump 130b. The non-linear component is canceled by introducing a fixed delay $T_D$ after the rising edge of the up signal. The cancellation of the non-linear component results in (a) the transfer function of output charge Q versus phase error dθ resembling the ideal transfer function shown in FIG. 4A and (b) the charge pump gain resembling the ideal gain function shown in FIG. 4B.

The fixed delay $T_D$ may be selected as follows:

$$T_D > T_{ON} + dt_{MAX}, \qquad \text{Eq (6)}$$

where $T_{ON}$ is an on time used to account for the dead zone of the charge pump, and $dt_{MAX}$ is an expected maximum time difference between the rising edges of the reference and clock signals when the PLL is locked.

Linear operation by the phase frequency detector and the charge pump is typically only needed when the PLL is locked. Phase noise, spurious signal levels, and other specifications are normally applicable for a locked PLL. When the PLL is locked, there is a range of time/phase differences between the reference signal and the clock signal at the inputs of the phase frequency detector. This range of time/phase differences may be dependent on various factors such as, e.g., the factors N and N+1 used for divider 160, the divider control from delta-sigma modulator 170 (which may be dependent on the topology or design of the delta-sigma modulator), etc. The range of time/phase differences may be determined via computer simulation, empirical measurements, etc. For example, a histogram of time/phase differences may be obtained for many clock cycles during frequency lock for a specific PLL and delta-sigma modulator design. $dt_{MAX}$ may then be selected based on the histogram, e.g., set equal to the time/phase difference that covers a target percentage (e.g., 99%) of the clock cycles.

Selecting a sufficiently long fixed delay $T_D$, e.g., as shown in equation (6), ensures that the current sources within the charge pump will be fully turned on for all input conditions. This also ensures that the signal designated to reset the flip-flops (e.g., the up signal in FIG. 5A) will actually reset the flip-flops after a delay of $T_D$ when the PLL is locked. The fixed delay may also be a programmable value.

When the PLL is not locked, the time/phase difference dt may be larger than $dt_{MAX}$. When the up signal leads the down signal, the rising edge of the down signal resets the flip-flops after $T_{ON}$. When the down signal leads the up signal, the rising edge of the up signal resets the flip-flops after $T_D$. The phase frequency detector and charge pump still function properly but are not linearized when the PLL is not locked, which is normally acceptable behavior.

In general, a PLL may include a phase frequency detector that receives a reference signal and a clock signal, generates first and second signals based on the reference and clock signals, and resets the first and second signals based on only the first signal. The first and second signals may correspond to up and down signals, respectively, and may be generated based on the reference and clock signals, respectively, e.g., as shown in FIG. 5A. Alternatively, the first and second signals may correspond to down and up signals, respectively, and may be generated based on the clock and reference signals, respectively, e.g., as shown in FIG. 5B. The phase frequency detector may delay the first signal by a predetermined amount, generate a reset signal based on the delayed first signal and the second signal, and reset the first and second signals based on the reset signal. The predetermined amount of delay may be selected, e.g., as shown in equation (6), or may be programmable.

A charge pump receives the first and second signals and generates an output signal indicative of the phase error between the reference signal and the clock signal. The charge pump may provide a first current to the output signal based on the first signal and may provide a second current to the output signal based on the second signal, with the first current and second current having opposite polarity. The phase frequency detector and charge pump may be implemented as shown in FIG. 5A or 5B or some other design.

Figure 7:
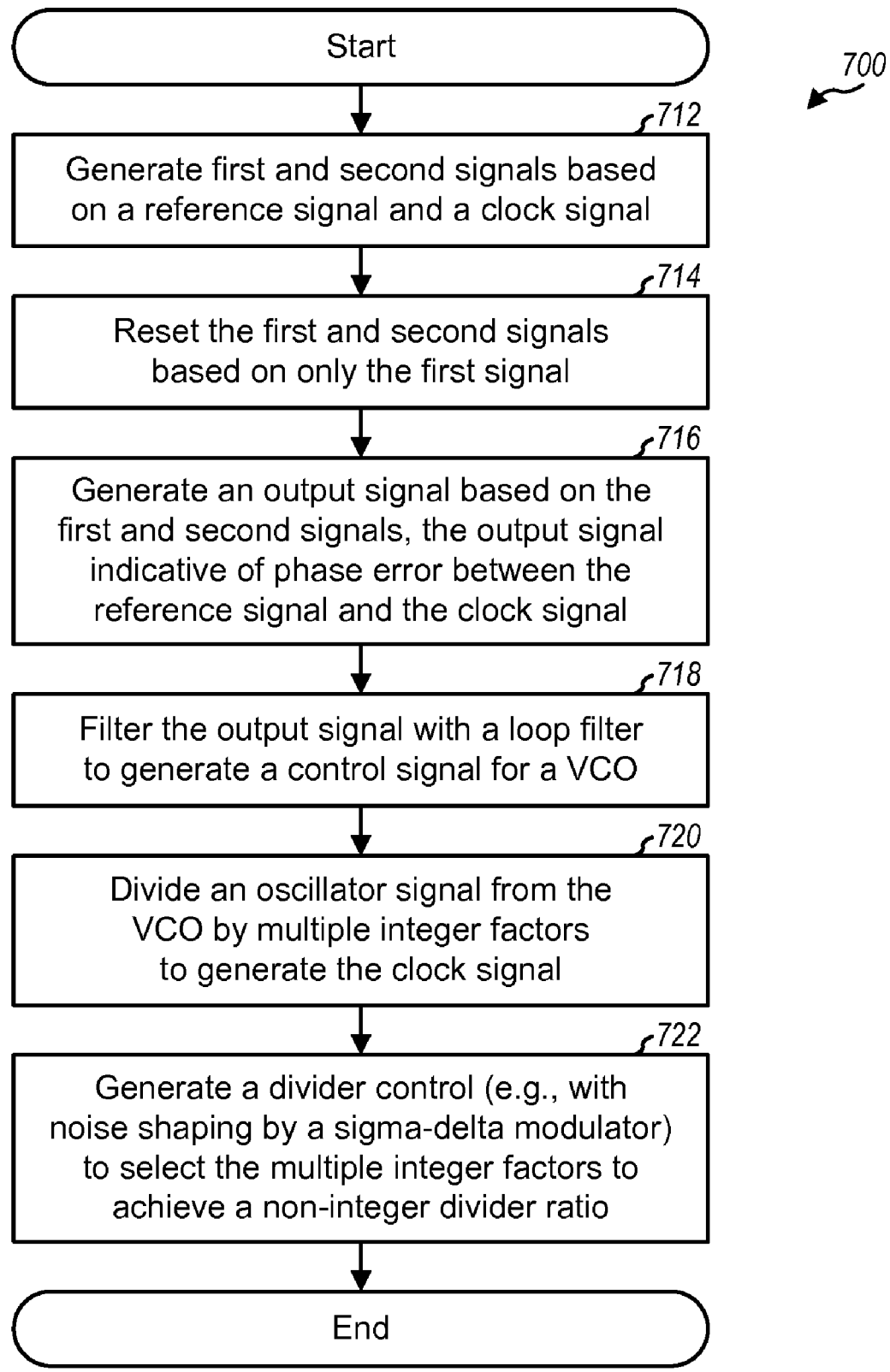
FIG. 7 shows a process for operating a PLL.

FIG. 7 shows a process 700 for operating a PLL. First and second signals are generated based on a reference signal and a clock signal (block 712). The first and second signals are reset based on only the first signal (block 714). An output signal that is indicative of phase error between the reference signal and the clock signal is generated based on the first and second signals (block 716). The output signal may be filtered with a loop filter to generate a control signal for a VCO (block 718). An oscillator signal from the VCO may be divided by multiple integer factors (e.g., N and N+1) to generate the clock signal (block 720). A divider control may be generated (e.g., with noise shaping by a sigma-delta modulator) to select the multiple integer factors to achieve a non-integer divider ratio (block 722).

The linear phase frequency detector and charge pump described herein may be used for various types of PLLs, as noted above, and are especially advantageous for signal-delta fractional-N PLLs. A signal-delta fractional-N PLL uses noise shaping by a signal-delta modulator to push quantization noise to higher frequencies, which may be more easily filtered by loop filter 140. Non-linearity in the charge pump may cause the higher frequency noise to fold back to lower frequencies and degrade performance. Linearizing the charge pump as described above reduces noise folding effects. Linearizing the charge pump may also reduce fractional spurs or extraneous tones generated from non-linear mixing and intermodulation.

The linear phase frequency detector and charge pump described herein may provide various advantages. Linear operation may be achieved even in the presence of mismatch in transistor devices and finite output impedance of the current sources in the charge pump. Consequently, current matching requirements for the current sources may be relaxed, voltage compliance requirements for the charge pump may be improved, and smaller transistor sizes may be used for the charge pump. Furthermore, close-in phase noise may improve, fractional spurious signal level may be lowered, and overall PLL performance may improve. Transistor device mismatch may now cause only reference spurs, which may be suppressed below noise level in a properly designed fractional-N PLL.

The linear phase frequency detector and charge pump described herein may be used for various electronics circuits. The use of the linear phase frequency detector and charge pump for a wireless communication device is described below.

Figure 8:
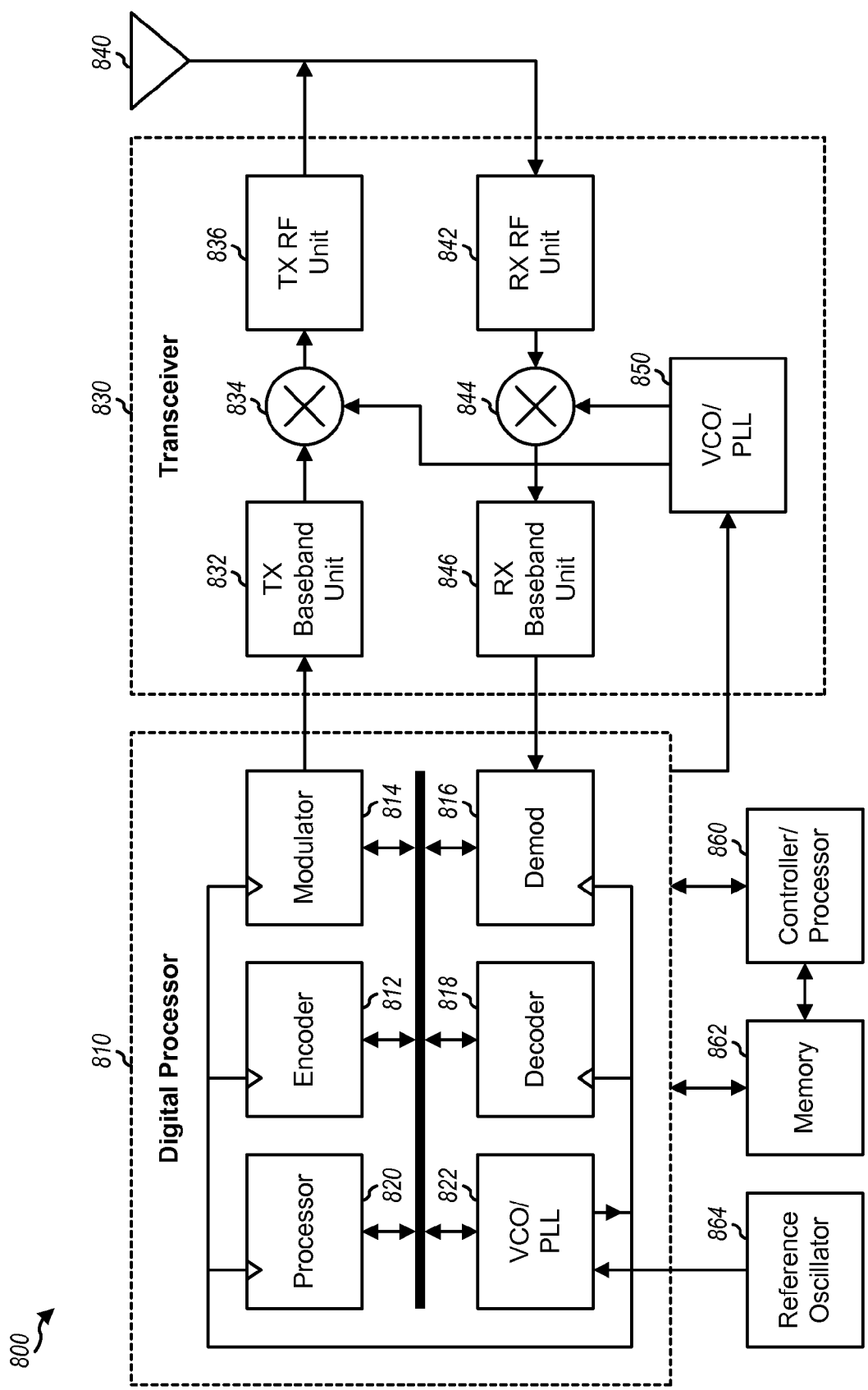
FIG. 8 shows a block diagram of a wireless communication device.

FIG. 8 shows a block diagram of a design of a wireless device 800 in a wireless communication system. Wireless device 800 may be a cellular phone, a terminal, a personal digital assistant (PDA), a handset, or some other device. The wireless communication system may be a Code Division Multiple Access (CDMA) system, a Time Division Multiple Access (TDMA) system, a Frequency Division Multiple Access (FDMA) system, a Global System for Mobile Communications (GSM) system, an Orthogonal FDMA (OFDMA) system, a wireless local area network (WLAN), etc.

Wireless device 800 includes a digital processor 810 and a transceiver 830 that support bi-directional communication. Digital processor 810 may be implemented with one or more application specific integrated circuits (ASICs), etc. Transceiver 830 may be implemented with one or more RF integrated circuits (RFICs), etc.

For data transmission, an encoder 812 processes (e.g., formats, encodes, and interleaves) data to be transmitted, and a modulator 814 further processes (e.g., modulates and scrambles) the coded data to generate data chips. Within transceiver 830, a transmit (TX) baseband unit 832 performs baseband processing such as digital-to-analog conversion, filtering, amplification, etc. A mixer 834 upconverts the baseband signal to radio frequency (RF). A TX RF unit 836 performs signal conditioning such as filtering and power amplification and generates an RF modulated signal, which is transmitted via an antenna 840.

For data reception, a receive (RX) RF unit 842 receives an input RF signal from antenna 840 and performs signal conditioning such as low noise amplification and filtering. A mixer 844 downconverts the conditioned RF signal from RF to baseband. An RX baseband unit 846 performs baseband processing such as filtering, amplification, analog-to-digital conversion, etc. A demodulator (Demod) 816 processes (e.g., descrambles and demodulates) the input samples from unit 846 and provides symbol estimates. A decoder 818 processes (e.g., deinterleaves and decodes) the symbol estimates and provides decoded data. In general, the processing by data processor 810 and transceiver 830 is dependent on the design of the wireless system.

A processor 820 may support various applications such as video, audio, graphics, and so on. A controller/processor 860 directs the operation of various processing units within wireless device 800. A memory 862 stores program codes and data for wireless device 800.

A VCO/PLL 822 generates clock signals for the processing units within digital processor 810. A VCO/PLL 850 generates a transmit LO signal used by mixer 834 for frequency upconversion and a receive LO signal used by mixer 844 for frequency downconversion. VCO/PLL 822 and VCO/PLL 850 may each employ linear phase frequency detector and charge pump to improve performance. A reference oscillator 864 generates a reference signal for VCO/PLL 822 and/or VCO/PLL 850. Reference oscillator 864 may be a crystal oscillator (XO), voltage-controlled XO (VCXO), a temperature-compensated XO (TCXO), or some other type of oscillator.

The phase frequency detector, charge pump, and PLL described herein may be implemented in an analog IC, an RFIC, an ASIC, a digital signal processor (DSP), a digital signal processing device (DSPD), a programmable logic device (PLD), a field programmable gate array (FPGA), a processor, a controller, a micro-controller, a microprocessor, and other electronic units. The phase frequency detector, charge pump, and PLL may be fabricated with various IC process technologies such as N-MOS, P-MOS, CMOS, BJT, GaAs, and so on. The phase frequency detector, charge pump, and PLL may also be implemented with discrete components.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A device comprising:
   a phase frequency detector configured to receive a reference signal and a clock signal, to generate first and second signals based on the reference and clock signals, to delay the first signal by a predetermined amount, to generate a reset signal based on the delayed first signal, and to reset the first and second signals based on the reset signal; and
   a charge pump configured to receive the first and second signals and generate an output signal indicative of phase error between the reference and clock signals,
   wherein the predetermined amount of delay is greater than an on time to account for a dead zone of the charge pump plus an expected maximum time difference between the reference signal and the clock signal after achieving frequency lock.

2. The device of claim 1, wherein the first signal is an up signal indicative of the reference signal being early with respect to the clock signal, and wherein the second signal is a down signal indicative of the reference signal being late with respect to the clock signal.

3. The device of claim 1, wherein the first signal is a down signal indicative of the reference signal being late with respect to the clock signal, and wherein the second signal is an up signal indicative of the reference signal being early with respect to the clock signal.

4. The device of claim 1, wherein the phase frequency detector is configured to generate the reset signal further based on the second signal.

5. The device of claim 1, wherein the phase frequency detector comprises
   a first flip-flop configured to receive the reference signal and provide the first signal,
   a second flip-flop configured to receive the clock signal and provide the second signal,
   a delay unit configured to delay the first signal by a predetermined amount, and
   a circuit configured to generate a reset signal for the first and second flip-flops based on the delayed first signal and the second signal.

6. The device of claim 1, wherein the phase frequency detector comprises
   a first flip-flop configured to receive the clock signal and provide the first signal,
   a second flip-flop configured to receive the reference signal and provide the second signal,
   a delay unit configured to delay the first signal by a predetermined amount, and a circuit configured to generate a reset signal for the first and second flip-flops based on the delayed first signal and the second signal.

7. The device of claim 1, wherein the charge pump comprises
a first current source configured to provide first current to the output signal,
a second current source configured to provide second current to the output signal, the first and second current having opposite polarity,
a first switch configured to couple the first current source to the output signal when enabled by the first signal, and
a second switch configured to couple the second current source to the output signal when enabled by the second signal.

8. The device of claim 1, further comprising:
a divider configured to divide an oscillator signal by multiple integer factors to generate the clock signal.

9. The device of claim 8, further comprising:
a sigma-delta modulator configured to receive a non-integer divider ratio and generate a divider control to select the multiple integer factors for the divider.

10. The device of claim 1, wherein the predetermined amount of delay is programmable.

11. An integrated circuit comprising:
a phase frequency detector configured to receive a reference signal and a clock signal, to generate first and second signals based on the reference and clock signals, to delay the first signal by a predetermined amount, to generate a reset signal based on the delayed first signal, and to reset the first and second signals based on the reset signal; and
a charge pump configured to receive the first and second signals and generate an output signal indicative of phase error between the reference and clock signals,
wherein the predetermined amount of delay is greater than an on time to account for a dead zone of the charge pump plus an expected maximum time difference between the reference signal and the clock signal after achieving frequency lock.

12. The integrated circuit of claim 11, wherein the first signal is an up signal indicative of the reference signal being early with respect to the clock signal, and wherein the second signal is a down signal indicative of the reference signal being late with respect to the clock signal.

13. The integrated circuit of claim 11, wherein the first signal is a down signal indicative of the reference signal being late with respect to the clock signal, and wherein the second signal is an up signal indicative of the reference signal being early with respect to the clock signal.

14. The integrated circuit of claim 11, wherein the phase frequency detector is configured to generate the reset signal further based on the second signal.

15. The integrated circuit of claim 11, wherein the phase frequency detector comprises:
a first flip-flop configured to receive the reference signal and provide the first signal;
a second flip-flop configured to receive the clock signal and provide the second signal;
a delay unit configured to delay the first signal by a predetermined amount; and
a circuit configured to generate a reset signal for the first and second flip-flops based on the delayed first signal and the second signal.

16. The integrated circuit of claim 11, wherein the phase frequency detector comprises:
a first flip-flop configured to receive the clock signal and provide the first signal;
a second flip-flop configured to receive the reference signal and provide the second signal;
a delay unit configured to delay the first signal by a predetermined amount; and
a circuit configured to generate a reset signal for the first and second flip-flops based on the delayed first signal and the second signal.

17. The integrated circuit of claim 11, wherein the charge pump comprises:
a first current source configured to provide first current to the output signal;
a second current source configured to provide second current to the output signal, the first and second current having opposite polarity;
a first switch configured to couple the first current source to the output signal when enabled by the first signal; and
a second switch configured to couple the second current source to the output signal when enabled by the second signal.

18. The integrated circuit of claim 11, further comprising:
a divider configured to divide an oscillator signal by multiple integer factors to generate the clock signal.

19. The integrated circuit of claim 18, further comprising:
a sigma-delta modulator configured to receive a non-integer divider ratio and generate a divider control to select the multiple integer factors for the divider.

20. The integrated circuit of claim 11, wherein the predetermined amount of delay is programmable.

21. A method for achieving linear operation in a phase frequency detector and a charge pump in a phase locked loop (PLL) comprising:
generating first and second signals in the phase frequency detector based on a reference signal and a clock signal;
delaying the first signal by a predetermined amount, wherein the predetermined amount of delay is greater than an on time to account for a dead zone of the charge pump plus an expected maximum time difference between the reference signal and the clock signal after achieving frequency lock;
generating a reset signal based on the delayed first signal;
resetting the first and second signals based on the generated reset signal; and
generating an output signal in the charge pump based on the first and second signals, the output signal indicative of phase error between the reference signal and the clock signal.

22. The method of claim 21, wherein the generating the output signal comprises
providing first current to the output signal based on the first signal, and
providing second current to the output signal based on the second signal, the first and second current having opposite polarity.

23. The method of claim 21, further comprising:
dividing an oscillator signal by multiple integer factors to generate the clock signal; and
generating a divider control to select the multiple integer factors to achieve a non-integer divider ratio.

24. An apparatus comprising:
means for generating first and second signals based on a reference signal and a clock signal;
means for delaying the first signal by a predetermined amount, wherein the predetermined amount of delay is greater than an on time to account for a dead zone of the charge pump plus an expected maximum time difference between the reference signal and the clock signal after achieving frequency lock;

means for generating a reset signal based on the delayed first signal;

means for resetting the first and second signals based on the generated reset signal; and means for generating an output signal based on the first and second signals, the output signal indicative of phase error between the reference signal and the clock signal.

25. The apparatus of claim 24, wherein the means for generating the output signal comprises:

means for providing first current to the output signal based on the first signal; and means for providing second current to the output signal based on the second signal, the first and second current having opposite polarity.

26. The apparatus of claim 24, further comprising:

means for dividing an oscillator signal by multiple integer factors to generate the clock signal; and means for generating a divider control to select the multiple integer factors to achieve a non-integer divider ratio.

27. A wireless device comprising:

a phase-locked loop including a phase frequency detector configured to receive a reference signal and a clock signal, to generate first and second signals based on the reference and clock signals, to delay the first signal by a predetermined amount, to generate a reset signal based on the delayed first signal, and to reset the first and second signals based on the reset signal; and a charge pump configured to receive the first and second signals and generate an output signal indicative of phase error between the reference and clock signals, wherein the predetermined amount of delay is greater than an on time to account for a dead zone of the charge pump plus an expected maximum time difference between the reference signal and the clock signal after achieving frequency lock.

28. The wireless device of claim 27, wherein the phase-locked loop further includes a divider configured to divide an oscillator signal by multiple integer factors to generate the clock signal, and a sigma-delta modulator configured to receive a non-integer divider ratio and generate a divider control to select the multiple integer factors for the divider.

29. The wireless device of claim 27, wherein the first signal is an up signal indicative of the reference signal being early with respect to the clock signal, and wherein the second signal is a down signal indicative of the reference signal being late with respect to the clock signal.

30. The wireless device of claim 27, wherein the first signal is a down signal indicative of the reference signal being late with respect to the clock signal, and wherein the second signal is an up signal indicative of the reference signal being early with respect to the clock signal.

31. The wireless device of claim 27, wherein the phase frequency detector of the phase-locked loop is configured to generate the reset signal further based on the second signal.

32. The wireless device of claim 27, wherein the phase frequency detector of the phase-locked loop comprises:

a first flip-flop configured to receive the reference signal and provide the first signal;

a second flip-flop configured to receive the clock signal and provide the second signal;

a delay unit configured to delay the first signal by a predetermined amount; and a circuit configured to generate a reset signal for the first and second flip-flops based on the delayed first signal and the second signal.

33. The wireless device of claim 27, wherein the phase frequency detector of the phase-locked loop comprises:

a first flip-flop configured to receive the clock signal and provide the first signal;

a second flip-flop configured to receive the reference signal and provide the second signal;

a delay unit configured to delay the first signal by a predetermined amount; and a circuit configured to generate a reset signal for the first and second flip-flops based on the delayed first signal and the second signal.

34. The wireless device of claim 27, wherein the charge pump of the phase-locked loop comprises:

a first current source configured to provide first current to the output signal;

a second current source configured to provide second current to the output signal, the first and second current having opposite polarity;

a first switch configured to couple the first current source to the output signal when enabled by the first signal; and a second switch configured to couple the second current source to the output signal when enabled by the second signal.

35. The wireless device of claim 27, wherein the predetermined amount of delay is programmable.

* * * * *